United States Patent
Park et al.

(10) Patent No.: US 9,231,639 B2
(45) Date of Patent: Jan. 5, 2016

(54) HIGH FREQUENCY TRANSCEIVER

(71) Applicant: Electronics & Telecommunications Research Institute, Daejeon (KR)

(72) Inventors: Bong Hyuk Park, Daejeon (KR); Moon Sik Lee, Daejeon (KR); Kwang Chun Lee, Daejeon (KR)

(73) Assignee: Electronics & Telecommunications Research Insitute, Daejeon (KR)

( * ) Notice: Subject to any disclaimer, the term of this patent is extended or adjusted under 35 U.S.C. 154(b) by 0 days.

(21) Appl. No.: 14/619,493

(22) Filed: Feb. 11, 2015

(65) Prior Publication Data

US 2015/0229344 A1 Aug. 13, 2015

(30) Foreign Application Priority Data

Feb. 12, 2014 (KR) .......................... 10-2014-0016151

(51) Int. Cl.
*H04B 1/38* (2015.01)
*H04B 1/3827* (2015.01)
*H04B 1/04* (2006.01)
*H04L 27/02* (2006.01)

(52) U.S. Cl.
CPC ............ *H04B 1/3827* (2013.01); *H04B 1/0475* (2013.01); *H04L 27/02* (2013.01); *H04B 2001/0408* (2013.01)

(58) Field of Classification Search
USPC ......... 375/219, 257, 279, 283–284, 295, 316, 375/329, 330, 340, 346, 377
See application file for complete search history.

(56) References Cited

U.S. PATENT DOCUMENTS

| | | | | |
|---|---|---|---|---|
| 5,323,125 | A * | 6/1994 | Hiben et al. | 332/100 |
| 7,915,935 | B1 * | 3/2011 | Menon et al. | 327/159 |
| 2005/0014466 | A1 | 1/2005 | Park et al. | |
| 2006/0119493 | A1 * | 6/2006 | Tal et al. | 341/143 |
| 2007/0072556 | A1 | 3/2007 | Rozenblit et al. | |
| 2007/0189417 | A1 * | 8/2007 | Waheed et al. | 375/300 |
| 2008/0266015 | A1 * | 10/2008 | Matteijssen et al. | 332/103 |
| 2009/0258612 | A1 * | 10/2009 | Zhuang et al. | 455/110 |
| 2011/0122932 | A1 | 5/2011 | Lovberg et al. | |
| 2012/0146842 | A1 | 6/2012 | Kang | |
| 2013/0187714 | A1 * | 7/2013 | Ben-Yishay et al. | 330/252 |

FOREIGN PATENT DOCUMENTS

KR 10-2006-0082718 A 7/2006

* cited by examiner

*Primary Examiner* — Khanh C Tran
(74) *Attorney, Agent, or Firm* — NSIP Law

(57) ABSTRACT

There is provided a high frequency transceiver appropriate for ultra low power and high frequency characteristics. The high frequency transmitting device includes a voltage controlled oscillator configured to provide an oscillation signal; and a power amplifier configured to multiply the oscillation signal by an integer to generate a carrier signal, mix the carrier signal and a baseband signal to generate a mixed signal, and amplify power of the mixed signal.

14 Claims, 3 Drawing Sheets

HIGH FREQUENCY TRANSCEIVER

CLAIM FOR PRIORITY

This application claims priority to Korean Patent Application No. 2014-0016151 filed on Feb. 12, 2014 in the Korean Intellectual Property Office (KIPO), the entire contents of which are hereby incorporated by reference.

BACKGROUND

1. Technical Field

Example embodiments of the present invention relate to a wireless communication device, and more specifically, to a high frequency transceiver.

2. Related Art

A transmitting and receiving device is a transceiver in which a transmitter and a receiver are combined and is a device capable of transmitting and receiving data for data transmission. Transceivers are generally used for a wireless communication device such as a cellular phone, a wireless phone or a portable radio transceiver.

In recent high speed data communication systems, that is, in systems configured to transmit data between two terminals that include a reader and a tag such as radio frequency identification (RFID) and near field communication (NFC), and in application systems such as chip to chip communication and board to board communication, since data should be transmitted and received instantaneously at a high speed, a frequency applied to the transceiver becomes higher. Also, since the high speed data communication system needs to have low battery consumption, the transceiver of ultra low power needs to be designed.

However, since a transmitter of a transceiver in the related art has a structure in which a frequency multiplier and a power amplifier are separated, power consumption increases. Therefore, it is inappropriate for ultra low power and high frequency characteristics.

Also, in the transceiver in the related art, since a receiver includes a separate mixer in order to output an intermediate frequency (IF) signal, power consumption increases. Therefore, it is inappropriate for ultra low power and high frequency characteristics.

SUMMARY

Accordingly, example embodiments of the present invention are provided to substantially obviate one or more problems due to limitations and disadvantages of the related art.

In view of the above-described problems, the present invention provides a high frequency transceiver appropriate for ultra low power and high frequency characteristics.

In some example embodiments, a high frequency transmitting device includes a voltage controlled oscillator configured to provide an oscillation signal; and a power amplifier configured to multiply the oscillation signal by an integer to generate a carrier signal, mix the carrier signal and a baseband signal to generate a mixed signal, and amplify power of the mixed signal.

The power amplifier may include a frequency multiplying unit configured to generate harmonic components of the oscillation signal based on a nonlinear operation and generate the carrier signal; and a power amplifying unit configured to generate the mixed signal according to a switching operation corresponding to the baseband signal and amplify power of the mixed signal.

The frequency multiplying unit may include a first transistor and a second transistor that perform a turn on or turn off operation when each oscillation signal is applied to a gate.

The power amplifying unit may include a third transistor having a gate and a fourth transistor having a gate, and the baseband signal may be applied to the gate of the third transistor or the gate of the fourth transistor.

The power amplifier may further include a balun configured to convert the power amplified mixed signal of the power amplifying unit into a single ended signal.

The oscillation signal may be a differential signal.

The baseband signal may be a signal that is modulated through an on-off keying (OOK) technique or an amplitude-shift keying (ASK) technique.

In other example embodiments, a high frequency receiving device includes a signal amplifying unit configured to perform phase shifting on a mixed signal in which a baseband signal and a carrier signal are mixed and amplify a size of the mixed signal based on the phase-shifted mixed signal; and a signal extracting unit configured to remove the amplified carrier signal within the mixed signal amplified by the signal amplifying unit using a stub and extract the amplified baseband signal.

The signal amplifying unit may include a low noise amplifier configured to remove noise included in the mixed signal and amplify a size of the mixed signal; a transmission line configured to perform phase shifting on a signal output from the low noise amplifier to generate a first phase-shifted signal; and a mixer configured to receive a signal output from the low noise amplifier and perform phase shifting on the signal to generate a second phase-shifted signal, and mix the first phase-shifted signal and the second phase-shifted signal.

The transmission line may include a transmission line having a length of $\lambda/2$.

The mixer may include a first transistor configured to perform a turn on or turn off operation when the signal output from the low noise amplifier is applied to a gate; and a second transistor configured to perform a turn on or turn off operation when the first phase-shifted signal is applied to a gate.

The stub may include a parallel short stub having a length of $\lambda/4$.

The device may further include a baseband amplifier that includes a baseband amplifying unit configured to amplify a size of the extracted baseband signal; and a signal converting unit configured to convert a signal output from the baseband amplifying unit into a differential signal.

The baseband signal may be a signal that is modulated through an on-off keying (OOK) technique or an amplitude-shift keying (ASK) technique.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
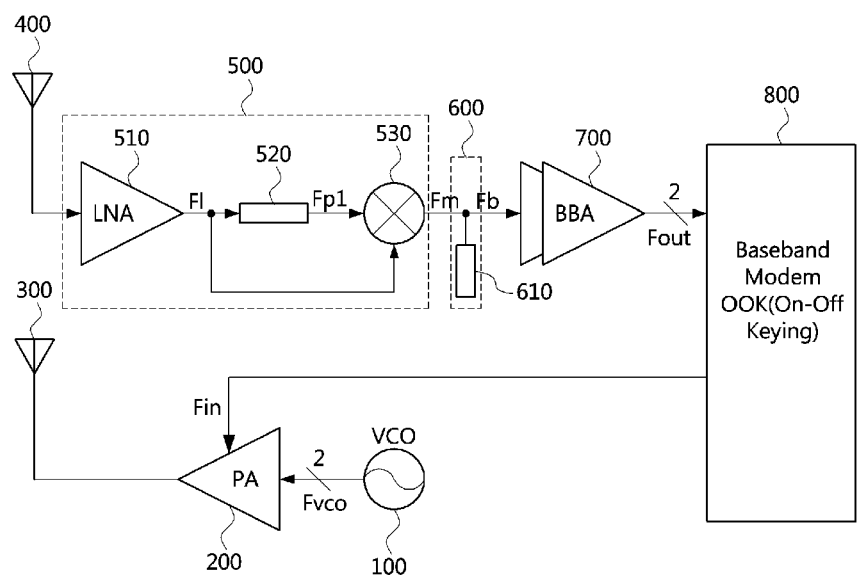
FIG. 1 is a diagram illustrating a concept of a high frequency transceiver according to an embodiment of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a high frequency transmitting device according to an embodiment of the present invention will be described with reference to the accompanying drawings.

FIG. 1 is a diagram illustrating a concept of a high frequency transceiver according to an embodiment of the present invention.

As illustrated in FIG. 1, the high frequency transmitting device according to the embodiment of the present invention includes a voltage controlled oscillator (VCO) 100 and a power amplifier (PA) 200, and may also include a transmitting antenna 300 and a baseband modem 800.

The voltage controlled oscillator 100 may generate an oscillation signal Fvco corresponding to a voltage to be applied. Also, the voltage controlled oscillator 100 may provide the generated oscillation signal Fvco to the power amplifier 200 to be described below.

Here, the oscillation signal Fvco may be a differential signal.

Here, the oscillation signal Fvco may have an oscillation frequency that is one-half (½) of a carrier frequency. That is, when the carrier frequency is 60 GHz, the voltage controlled oscillator 100 may generate an oscillation signal Fvco having an oscillation frequency of 30 GHz.

The baseband modem 800 is a modulator/demodulator, and may modulate a baseband signal through an on-off keying (OOK) technique or an amplitude-shift keying (ASK) technique and generate the modulated signal.

Here, the modulation technique is not limited to the OOK technique or the ASK technique, but any technique that can modulate the baseband signal may be used.

Also, the term "baseband signal" to be described below refers to a baseband signal or a signal obtained by modulating the baseband signal.

Also, the baseband modem 800 may provide the generated baseband signal Fin to the power amplifier 200 to be described below.

The power amplifier 200 may be connected to outputs of the voltage controlled oscillator 100 and the baseband modem 800.

Here, the power amplifier 200 may receive the oscillation signal Fvco from the voltage controlled oscillator 100. Also, the power amplifier 200 may multiply the received oscillation signal Fvco by an integer to generate a carrier signal.

Here, the power amplifier 200 may receive the baseband signal Fin from the baseband modem 800.

Also, the power amplifier 200 may mix the generated carrier signal and the received baseband signal Fin and generate a mixed signal. Also, the power amplifier 200 may amplify power of the generated mixed signal and provide the amplified mixed signal to the transmitting antenna 300 to be described below.

Therefore, compared to a transmitting device in the related art that has a structure in which a frequency multiplier and a power amplifier are separated, a frequency multiplier and a power amplifier are implemented in one module in the high frequency transmitting device according to the embodiment of the present invention. Therefore, power consumption may decrease, ultra low power characteristics may be further improved, phase noise characteristics may be improved, and high frequency characteristics may be further improved.

Figure 2:
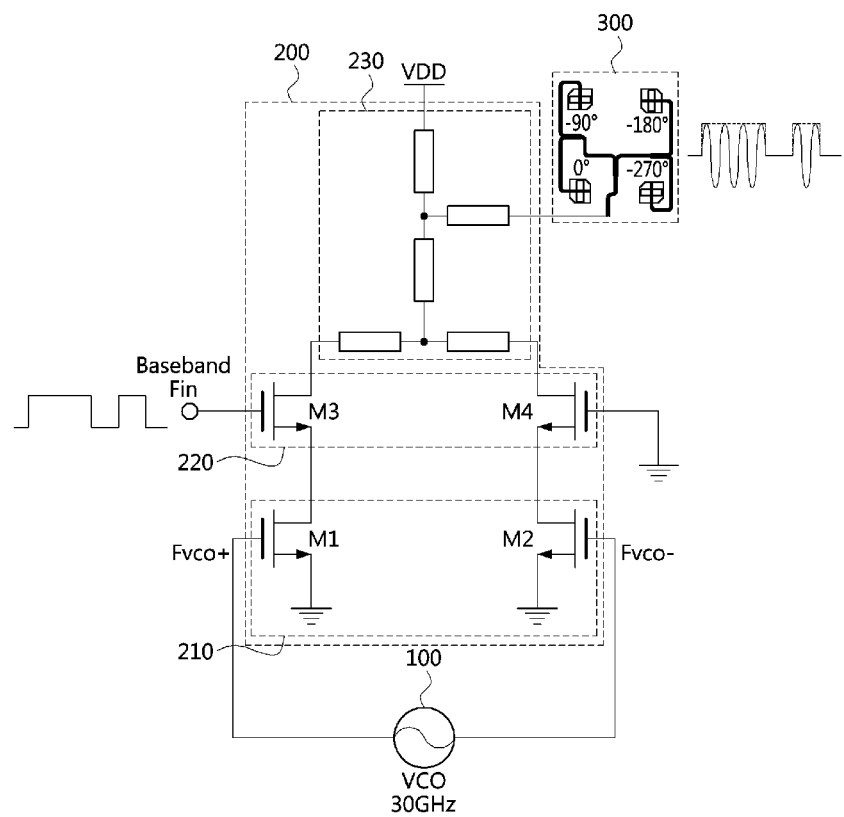
FIG. 2 is a circuit diagram illustrating a high frequency transmitting device according to an embodiment of the present invention.

FIG. 2 is a circuit diagram illustrating a high frequency transmitting device according to an embodiment of the present invention.

As illustrated in FIGS. 1 and 2, the power amplifier 200 of the high frequency transmitting device according to the embodiment of the present invention includes a frequency multiplying unit 210 and a power amplifying unit 220, and may also include a balun 230.

Hereinafter, parts that are the same as those in the high frequency transmitting device according to the embodiment of the present invention described in FIG. 1 will be omitted for simplicity of description.

The frequency multiplying unit 210 may be connected to an output of the voltage controlled oscillator 100. Also, the frequency multiplying unit 210 may receive the oscillation signal Fvco from the voltage controlled oscillator 100.

Also, the frequency multiplying unit 210 may distort the received oscillation signal Fvco based on a nonlinear operation, generate harmonic components, extract desired harmonic components from the generated harmonic components, and generate a carrier signal. Also, the frequency multiplying unit 210 may provide the generated carrier signal to the power amplifying unit 220 to be described below.

Also, the frequency multiplying unit 210 may include a first transistor M1 and a second transistor M2 that perform a turn on or turn off operation when each oscillation signal Fvco is applied to a gate.

Here, each oscillation signal Fvco may be a differential signal. Also, an oscillation signal applied to a gate of the first transistor M1 is referred to as a first oscillation signal Fvco+. Also, an oscillation signal applied to a gate of the second transistor M2 is referred to as a second oscillation signal Fvco−.

Here, the first transistor M1 and the second transistor M2 may be an NMOS transistor as illustrated in FIG. 2, but the present invention is not limited thereto. Any element that can perform a nonlinear operation may be used.

The first transistor M1 may include a gate, a source and a drain. Here, the gate of the first transistor M1 may receive the first oscillation signal Fvco+. Also, the source of the first transistor M1 may be connected to ground. Also, the drain of the first transistor M1 may be connected to a source of a third transistor M3 to be described below and provide the generated carrier signal to the third transistor M3.

The second transistor M2 may include a gate, a source and a drain. Here, the gate of the second transistor M2 may receive a second oscillation signal Fvco−. Also, the source of the second transistor M2 may be connected to ground. Also, the drain of the second transistor M2 may be connected to a source of a fourth transistor M4 to be described below and provide the generated carrier signal to the fourth transistor M4.

The power amplifying unit 220 may be connected to outputs of the baseband modem 800 and the frequency multiplying unit 210.

Here, the power amplifying unit 220 may receive the baseband signal Fin from the baseband modem 800 and perform a switching operation corresponding to the baseband signal Fin.

Here, the power amplifying unit 220 may receive the carrier signal from the frequency multiplying unit 210.

Also, the power amplifying unit 220 may mix the baseband signal Fin and the carrier signal according to the switching operation corresponding to the baseband signal Fin and generate the mixed signal. Also, the power amplifying unit 220 may amplify power of the mixed signal that is generated according to the switching operation corresponding to the baseband signal Fin. Also, the power amplifying unit 220 may provide the amplified mixed signal to the balun 230 to be described below.

Also, the power amplifying unit 220 may include the third transistor M3 having a gate and the fourth transistor M4 having a gate.

In particular, the baseband signal Fin may be applied to the gate of the third transistor M3 or the gate of the fourth transistor M4. In an example, the baseband signal Fin may be applied to the gate of the third transistor M3, and the gate of the fourth transistor M4 may be connected to ground. In another example, the baseband signal Fin may be applied to the gate of the fourth transistor M4, and the gate of the third transistor M3 may be connected to ground.

Here, the third transistor M3 and the fourth transistor M4 may be an NMOS transistor as illustrated in FIG. 2, but the present invention is not limited thereto. Any element that can mix signals and amplify power may be used.

The third transistor M3 may include a gate, a source and a drain. Here, the gate of the third transistor M3 may receive the baseband signal Fin. Also, the source of the third transistor M3 may be connected to the above-described drain of the first transistor M1 and receive the carrier signal. Also, the drain of the third transistor M3 may be connected to the balun 230 to be described below and provide a power amplified mixed signal.

The fourth transistor M4 may include a gate, a source and a drain. Here, the gate of the fourth transistor M4 may be connected to ground. Also, the source of the fourth transistor M4 may be connected to the above-described drain of the second transistor M2 and receive the carrier signal. Also, the drain of the fourth transistor M4 may be connected to the balun 230 to be described below.

Therefore, in the high frequency transmitting device according to the embodiment of the present invention, the power amplifier performs a switching operation by the baseband signal. Therefore, power consumption may decrease and ultra low power characteristics may be further improved.

The balun 230 may be connected to an output of the power amplifying unit 220. Here, the balun 230 may be provided between an unbalanced circuit and a balanced circuit to convert a signal exchanged therebetween.

Also, the balun 230 may convert the mixed signal amplified by the power amplifying unit 220 into a single ended signal. Also, the balun 230 may provide the converted single ended signal to the transmitting antenna 300.

Therefore, the high frequency transmitting device according to the embodiment of the present invention uses the balun to decrease undesired noise and pass only a desired signal. Accordingly, phase noise characteristics may be improved and high frequency characteristics may be further improved.

The transmitting antenna 300 may be connected to an output of the power amplifier 200. Also, the transmitting antenna 300 may receive the power amplified mixed signal from the power amplifier 200 and transmit the power amplified mixed signal in air.

Next, operations of the high frequency transmitting device according to the embodiment of the present invention will be described with reference to FIGS. 1 and 2.

When it is assumed that the high frequency transmitting device according to the embodiment of the present invention operates at a carrier frequency of a 60 GHz band, first, the voltage controlled oscillator 100 generates an oscillation signal Fvco having an oscillation frequency of 30 GHz corresponding to a voltage to be applied. Here, the oscillation signal Fvco may be the first oscillation signal Fvco+ or the second oscillation signal Fvco−, that is a differential signal.

Then, the first oscillation signal Fvco+ generated in the voltage controlled oscillator 100 is provided to the gate of the first transistor M1, and the second oscillation signal Fvco− is provided to the gate of the second transistor M2. The provided first oscillation signal Fvco+ and second oscillation signal Fvco− generate second harmonic components by nonlinear operations of the first transistor M1 and the second transistor M2 and generate a carrier signal of a 60 GHz band.

That is, according to the above-described nonlinear operation, the power amplifier of the high frequency transmitting device according to the embodiment of the present invention has an effect of multiplying a signal by two.

Then, the carrier signal generated in the first transistor M1 is provided from the drain of the first transistor M1 to the source of the third transistor M3. Also, the carrier signal generated in the second transistor M2 is provided from the drain of the second transistor M2 to the source of the fourth transistor M4.

The baseband modem 800 provides the baseband signal Fin. Here, the baseband signal Fin may be a signal that is modulated through the OOK technique.

Then, the baseband signal Fin generated in the baseband modem 800 is provided to the gate of the third transistor M3, and the third transistor M3 performs a switching operation by the provided baseband signal Fin.

Then, the third transistor M3 mixes the baseband signal Fin provided to the gate and the carrier signal provided to the source according to the switching operation, generates the mixed signal and amplifies power of the generated mixed signal. Then, the power amplified mixed signal is provided to the balun 230.

That is, the high frequency transmitting device according to the embodiment of the present invention has an effect of further decreasing power consumption according to the above-described switching operation.

Then, the power amplified mixed signals provided to the balun 230 are converted into the single ended signal, and the converted single ended signal is transmitted in air through the transmitting antenna 300 that is a final output end.

Components of the high frequency transmitting device according to the embodiment of the present invention have been described above. Hereinafter, a high frequency receiving device according to an embodiment of the present invention will be described with reference to the drawing. In particular, parts that are the same as those in the high frequency transmitting device according to the embodiment of the present invention will be omitted for simplicity of description.

FIG. 1 is a diagram illustrating a concept of a high frequency transceiver according to an embodiment of the present invention.

As illustrated in FIG. 1, the high frequency receiving device according to the embodiment of the present invention includes a signal amplifying unit 500 and a signal extracting unit 600, may include a receiving antenna 400 and the baseband modem 800, and may also include a baseband amplifier (BBA) 700.

The receiving antenna 400 may receive a mixed signal in which the baseband signal and the carrier signal are mixed. Also, the receiving antenna 400 may provide the received mixed signal to the signal amplifying unit 500 to be described below. Here, the baseband signal may be a signal that is modulated through the OOK technique or the ASK technique.

The signal amplifying unit 500 may be connected to an output of the receiving antenna 400. Also, the signal amplifying unit 500 may receive the above-described mixed signal from the receiving antenna 400. Also, the signal amplifying unit 500 may perform phase shifting on the received mixed signal and amplify a size of the mixed signal based on the phase-shifted mixed signal. Also, the signal amplifying unit 500 may provide the amplified mixed signal Fm to the signal extracting unit 600 to be described below.

The signal extracting unit 600 may be connected to an output of the signal amplifying unit 500. Also, the signal extracting unit 600 may receive the amplified mixed signal Fm from the signal amplifying unit 500. Also, the signal extracting unit 600 may remove the amplified carrier signal within the amplified mixed signal Fm using a stub 610. Also, the signal extracting unit 600 may extract the amplified baseband signal Fb within the amplified mixed signal Fm.

Here, the stub 610 is a line and may be additionally used for impedance matching and harmonic rejection other than signal transmission.

Here, the stub 610 may include any structure of a microstrip line, a strip line, a coaxial line and a waveguide structure.

Here, the stub 610 may include at least one stub of a serial stub, a parallel stub, an open stub and a short stub.

Here, the stub 610 may include a parallel short stub having a length of $\lambda/4$ as illustrated in FIG. 1.

Therefore, compared to a receiving device in the related art in which a separate mixer is provided in order to output an intermediate frequency (IF) signal, the high frequency receiving device according to the embodiment of the present invention removes the carrier signal using the stub and extracts the baseband signal. Therefore, power consumption may decrease and ultra low power characteristics may be further improved.

The baseband amplifier 700 may be connected to an output of the signal extracting unit 600. Also, the baseband amplifier 700 may receive the baseband signal Fb extracted from the signal extracting unit 600. Also, the baseband amplifier 700 may include a baseband amplifying unit (not illustrated) and a signal converting unit (not illustrated).

Here, the baseband amplifying unit (not illustrated) may receive the baseband signal Fb extracted from the signal extracting unit 600. Also, the baseband amplifying unit (not illustrated) may amplify a size of the received extracted baseband signal Fb. Also, the baseband amplifying unit (not illustrated) may provide the extracted baseband signal whose size is amplified to the signal converting unit (not illustrated) to be described below.

Here, the signal converting unit (not illustrated) may be connected to an output of the baseband amplifying unit (not illustrated). Also, the signal converting unit (not illustrated) may receive a signal that is output from the baseband amplifying unit (not illustrated). Also, the signal converting unit (not illustrated) may convert the signal output from the baseband amplifying unit (not illustrated) into a differential signal. Also, the signal converting unit (not illustrated) may provide the converted differential signal to the baseband modem 800.

Therefore, the high frequency receiving device according to the embodiment of the present invention uses the signal converting unit to decrease undesired noise and pass only a desired signal. Accordingly, phase noise characteristics may be improved and high frequency characteristics may be further improved.

The baseband modem 800 may be connected to an output of the baseband amplifier 700. Also, the baseband modem 800 may receive the converted differential signal from the baseband amplifier 700. Also, the baseband modem 800 may demodulate the converted differential signal and generate a demodulated baseband signal.

Figure 3:
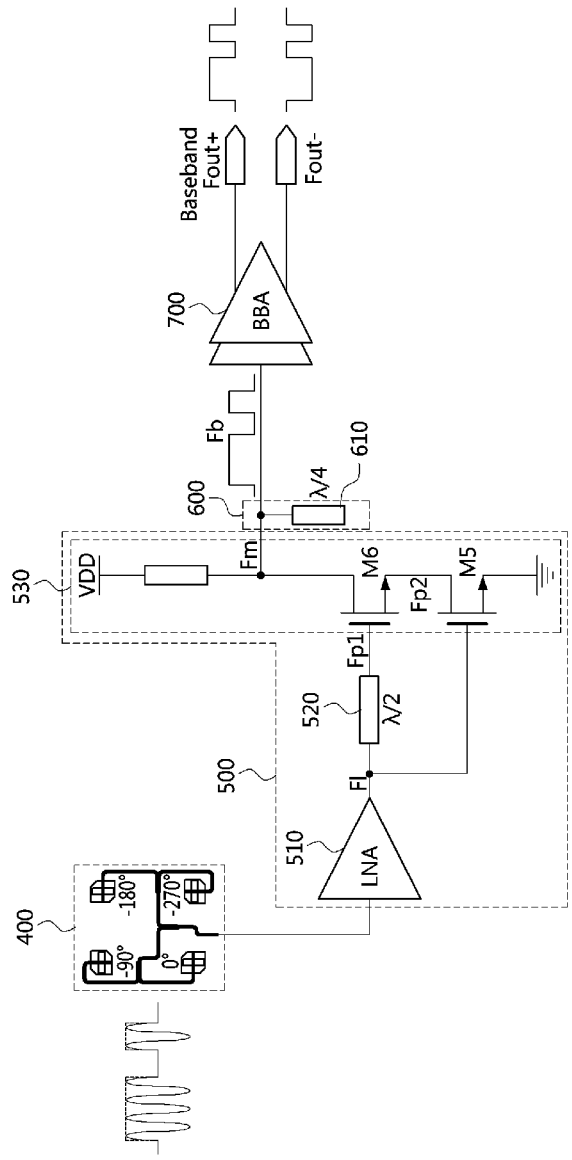
FIG. 3 is a circuit diagram illustrating a high frequency receiving device according to an embodiment of the present invention.

FIG. 3 is a circuit diagram illustrating a high frequency receiving device according to an embodiment of the present invention.

As illustrated in FIGS. 1 and 3, the signal amplifying unit 500 of the high frequency receiving device according to the embodiment of the present invention may include a low noise amplifier (LNA) 510, a transmission line 520 and a mixer 530.

The low noise amplifier 510 may be connected to an output of the receiving antenna 400. Also, the low noise amplifier 510 may receive the mixed signal from the receiving antenna 400. Also, the low noise amplifier 510 may remove noise included in the mixed signal and amplify a size of the mixed signal. Also, the low noise amplifier 510 may provide the amplified mixed signal F1 whose noise is removed to the transmission line 520 to be described below.

The transmission line 520 may be connected to an output of the low noise amplifier 510. Also, the transmission line 520 may receive a signal F1 output from the low noise amplifier 510. Also, the transmission line 520 may perform phase shifting on the signal F1 output from the low noise amplifier 510 and generate a first phase-shifted signal Fp1. Also, the transmission line 520 may provide the first phase-shifted signal Fp1 to the mixer 530 to be described below.

Here, the transmission line 520 may include a transmission line having a length of $\lambda/2$. That is, a phase of the signal output from the low noise amplifier 510 is shifted by 180 degrees when the signal passes through the transmission line having a length of $\lambda/2$.

The mixer 530 may be connected to outputs of the low noise amplifier 510 and the transmission line 520.

Here, the mixer 530 may receive the signal F1 output from the low noise amplifier 510. Also, the mixer 530 may perform phase shifting on the signal F1 output from the low noise amplifier 510 and generate a second phase-shifted signal Fp2. In particular, the second phase-shifted signal Fp2 may have the same phase as the first phase-shifted signal Fp1.

Here, the mixer 530 may receive the first phase-shifted signal Fp1 from the transmission line 520.

Also, the mixer 530 may mix the received first phase-shifted signal Fp1 and the generated second phase-shifted signal Fp2, amplify a size of the mixed signal, and provide the result to the signal extracting unit 600.

Also, the mixer 530 may include a first transistor M5 and a second transistor M6.

The first transistor M5 may receive the signal F1 output from the low noise amplifier 510 through a gate and perform a turn on or turn off operation. Also, the first transistor M5 may include a gate, a source and a drain.

Here, the gate of the first transistor M5 may receive the signal F1 output from the low noise amplifier 510. Also, the source of the first transistor M5 may be connected to ground. Also, the drain of the first transistor M5 may be connected to a source of the second transistor M6 to be described below and provide the generated second phase-shifted signal Fp2.

Here, the first transistor M5 may be an NMOS transistor as illustrated in FIG. 3, but the present invention is not limited thereto. Any element that can shift a phase may be used.

The second transistor M6 may receive the first phase-shifted signal Fp1 output from the transmission line 520 through a gate and perform a turn on or turn off operation. Also, the second transistor M6 may include a gate, a source and a drain.

Here, the gate of the second transistor M6 may receive the first phase-shifted signal Fp1 output from the transmission line 520. Also, the source of the second transistor M6 may be connected to the above-described drain of the first transistor M5 and receive the second phase-shifted signal Fp2. Also, the drain of the second transistor M6 may be connected to the signal extracting unit 600 and provide the signal Fm in which the first phase-shifted signal Fp1 and the second phase-shifted signal Fp2 are mixed and the size is amplified.

Here, the second transistor M6 may be an NMOS transistor as illustrated in FIG. 3, but the present invention is not limited thereto. Any element that can amplify a signal may be used.

Therefore, in the high frequency receiving device according to the embodiment of the present invention, the mixer is not provided but the stub is used. Therefore, power consumption may decrease and a simple design may be provided.

Next, operations of the high frequency receiving device according to the embodiment of the present invention will be described with reference to FIGS. 1 and 3.

The mixed signal, which is a high speed signal transmitted in air, is provided to the low noise amplifier 510 through the receiving antenna 400. Here, the mixed signal may be a signal in which the baseband signal and the carrier signal are mixed.

Noise of the mixed signal provided to the low noise amplifier 510 is removed and only a size of the signal is amplified. That is, in the high frequency receiving device according to the embodiment of the present invention, noise characteristics are improved by the low noise amplifier.

Then, the signal F1 output from the low noise amplifier 510 is provided to the transmission line 520 and the mixer 530.

Here, the output signal F1 of the low noise amplifier 510 provided to the transmission line 520 has a phase that is shifted by 180 degrees when the signal passes through the transmission line having a length of $\lambda/2$. This signal is referred to as the first phase-shifted signal Fp1. Then, the first phase-shifted signal Fp1 is provided to the gate of the second transistor M6 of the mixer 530.

Here, the output signal F1 of the low noise amplifier 510 provided to the mixer 530 has a phase that is shifted by 180 degrees when the signal passes through the first transistor M5. This signal is referred to as the second phase-shifted signal Fp2. Then, the second phase-shifted signal Fp2 is provided to the source of the second transistor M6.

Then, the first phase-shifted signal Fp1 and the second phase-shifted signal Fp2 are mixed according to a switching operation of the second transistor M6, and a size of the mixed signal is amplified.

Then, in the mixed signal Fm amplified in the second transistor M6, a carrier signal of 60 GHz is removed by a short circuit characteristic of the stub 610 having a length of $\lambda/4$, and only the amplified baseband signal Fb is extracted.

Then, the extracted baseband signal Fb has a size that is amplified through the baseband amplifier 700 and is converted into a differential signal.

Then, the converted differential signal is demodulated in the baseband modem 800 and the demodulated baseband signal is generated.

Therefore, the transceiver according to the embodiment of the present invention is advantageous in that it can be applied to various systems such as analog/RF systems of a microwave system, a millimeterwave system and a terahertz wave system.

When the multiplier and the power amplifier of the transmitting device are implemented in one module, power consumption decreases, ultra low power characteristics are further improved, phase noise characteristics are improved, and thus high frequency characteristics are further improved.

Also, when the power amplifier of the transmitting device performs a switching operation by the baseband signal, power consumption decreases and ultra low power characteristics are further improved.

When the receiving device removes the carrier signal using the stub and extracts the baseband signal, power consumption decreases and ultra low power characteristics are further improved.

Moreover, the present invention can be applied to various systems such analog/RF systems of a microwave system, a millimeterwave system and a terahertz wave system.

Furthermore, it is possible to design a simple transceiver.

While the example embodiments of the present invention and their advantages have been described above in detail, it should be understood that various changes, substitutions and alterations may be made herein without departing from the scope of the invention as defined by the following claims.

What is claimed is:

1. A high frequency transmitting device, comprising:
  a voltage controlled oscillator configured to provide an oscillation signal; and
  a power amplifier configured to multiply the oscillation signal by an integer to generate a carrier signal, mix the carrier signal and a baseband signal to generate a mixed signal, and amplify power of the mixed signal.

2. The device of claim 1,
  wherein the power amplifier includes
  a frequency multiplying unit configured to generate harmonic components of the oscillation signal based on a nonlinear operation and generate the carrier signal; and a power amplifying unit configured to generate the mixed signal according to a switching operation corresponding to the baseband signal and amplify power of the mixed signal.

3. The device of claim 2, wherein the frequency multiplying unit includes a first transistor and a second transistor that perform a turn on or turn off operation when each oscillation signal is applied to a gate.

4. The device of claim 2, wherein the power amplifying unit includes a third transistor having a gate and a fourth transistor having a gate, wherein the baseband signal is applied to the gate of the third transistor or the gate of the fourth transistor.

5. The device of claim 2, wherein the power amplifier further includes a balun configured to convert the power amplified mixed signal of the power amplifying unit into a single ended signal.

6. The device of claim 1, wherein the oscillation signal is a differential signal.

7. The device of claim 1, wherein the baseband signal is a signal that is modulated through an on-off keying (OOK) technique or an amplitude-shift keying (ASK) technique.

8. A high frequency receiving device, comprising:
a signal amplifying unit configured to perform phase shifting on a mixed signal in which a baseband signal and a carrier signal are mixed and amplify a size of the mixed signal based on the phase-shifted mixed signal; and
a signal extracting unit configured to remove the amplified carrier signal within the mixed signal amplified by the signal amplifying unit using a stub and extract the amplified baseband signal.

9. The device of claim 8, wherein the signal amplifying unit includes:
a low noise amplifier configured to remove noise included in the mixed signal and amplify a size of the mixed signal;
a transmission line configured to perform phase shifting on a signal output from the low noise amplifier to generate a first phase-shifted signal; and
a mixer configured to receive a signal output from the low noise amplifier and perform phase shifting on the signal to generate a second phase-shifted signal, and mix the first phase-shifted signal and the second phase-shifted signal.

10. The device of claim 9, wherein the transmission line includes a transmission line having a length of $\lambda/2$.

11. The device of claim 9, wherein the mixer includes
a first transistor configured to perform a turn on or turn off operation when the signal output from the low noise amplifier is applied to a gate; and
a second transistor configured to perform a turn on or turn off operation when the first phase-shifted signal is applied to a gate.

12. The device of claim 8, wherein the stub includes a parallel short stub having a length of $\lambda/4$.

13. The device of claim 8, further comprising
a baseband amplifier including,
a baseband amplifying unit configured to amplify a size of the extracted baseband signal; and
a signal converting unit configured to convert a signal output from the baseband amplifying unit into a differential signal.

14. The device of claim 8, wherein the baseband signal is a signal that is modulated through an on-off keying (OOK) technique or an amplitude-shift keying (ASK) technique.

* * * * *